(12) United States Patent
Halpert et al.

(10) Patent No.: US 9,505,978 B2
(45) Date of Patent: *Nov. 29, 2016

(54) BLUE LIGHT EMITTING SEMICONDUCTOR NANOCRYSTALS AND DEVICES

(75) Inventors: Jonathan E. Halpert, Cambridge, MA (US); Polina O. Anikeeva, Cambridge, MA (US); Moungi G. Bawendi, Cambridge, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 947 days.

This patent is subject to a terminal disclaimer.

(21) Appl. No.: 12/376,364

(22) PCT Filed: Aug. 9, 2007

(86) PCT No.: PCT/US2007/075593
§ 371 (c)(1),
(2), (4) Date: Oct. 27, 2010

(87) PCT Pub. No.: WO2008/021962
PCT Pub. Date: Feb. 21, 2008

(65) Prior Publication Data
US 2011/0127932 A1    Jun. 2, 2011

Related U.S. Application Data

(60) Provisional application No. 60/822,197, filed on Aug. 11, 2006.

(51) Int. Cl.
| | | |
|---|---|---|
| C09K 11/56 | (2006.01) | |
| H01L 33/06 | (2010.01) | |
| B82Y 20/00 | (2011.01) | |
| B82Y 30/00 | (2011.01) | |
| C09K 11/02 | (2006.01) | |
| H01L 51/50 | (2006.01) | |

(Continued)

(52) U.S. Cl.
CPC .............. *C09K 11/565* (2013.01); *B82Y 20/00* (2013.01); *B82Y 30/00* (2013.01); *C09K 11/025* (2013.01); *H01L 33/06* (2013.01); *H01L 51/5012* (2013.01); *H05B 33/14* (2013.01); *H01L 33/08* (2013.01)

(58) Field of Classification Search
CPC .............................. H01L 33/06; H01L 33/08
See application file for complete search history.

(56) References Cited

U.S. PATENT DOCUMENTS

| | | |
|---|---|---|
| 5,663,573 A | 9/1997 | Epstein et al. |
| 5,766,779 A | 6/1998 | Shi et al. |

(Continued)

FOREIGN PATENT DOCUMENTS

WO    WO 2005/086782    9/2005

OTHER PUBLICATIONS

Sharma TP, et al., Measurement of structural and optical band gaps of Cd1-xZnxS (x = .4 and .6) nanomaterials, Indian J of Pure & Applied Phys, 44, 125 (2006).*

(Continued)

*Primary Examiner* — Thao X Le
*Assistant Examiner* — Gardner W Swan
(74) *Attorney, Agent, or Firm* — Steptoe & Johnson LLP

(57) ABSTRACT

A blue light emitting semiconductor nanocrystal having an quantum yield of greater than 20% can be incorporated in a light emitting device.

13 Claims, 8 Drawing Sheets

(51) Int. Cl.
*H05B 33/14* (2006.01)
*H01L 33/08* (2010.01)

(56) References Cited

U.S. PATENT DOCUMENTS

| | | | |
|---|---|---|---|
| 6,501,091 | B1 | 12/2002 | Bawendi et al. |
| 6,602,671 | B1* | 8/2003 | Bawendi et al. .............. 435/7.1 |
| 6,608,439 | B1 | 8/2003 | Sokolik et al. |
| 6,617,583 | B1 | 9/2003 | Bawendi et al. |
| 6,803,719 | B1 | 10/2004 | Miller et al. |
| 6,955,856 | B2 | 10/2005 | Lee et al. |
| 7,056,471 | B1 | 6/2006 | Han et al. |
| 7,560,859 | B2* | 7/2009 | Saito et al. ................... 313/498 |
| 7,645,397 | B2 | 1/2010 | Parce et al. |
| 7,777,233 | B2 | 8/2010 | Kahen et al. |
| 7,935,419 | B1 | 5/2011 | Hollingsworth et al. |
| 8,377,333 | B2 | 2/2013 | Ramprasad et al. |
| 8,404,154 | B2 | 3/2013 | Breen et al. |
| 8,691,114 | B2 | 4/2014 | Ramprasad et al. |
| 8,906,265 | B2 | 12/2014 | Breen et al. |
| 2003/0017264 | A1 | 1/2003 | Treadway et al. |
| 2004/0023010 | A1 | 2/2004 | Bulovic et al. |
| 2004/0241424 | A1 | 12/2004 | Barbera-Guillem |
| 2005/0012182 | A1 | 1/2005 | Jang |
| 2005/0072989 | A1* | 4/2005 | Bawendi et al. .............. 257/200 |
| 2005/0117868 | A1 | 6/2005 | Chen et al. |
| 2005/0135079 | A1 | 6/2005 | Chua et al. |
| 2005/0258418 | A1 | 11/2005 | Steckel et al. |
| 2006/0068154 | A1 | 3/2006 | Parce et al. |
| 2006/0158089 | A1 | 7/2006 | Saito et al. |
| 2006/0232194 | A1 | 10/2006 | Tung et al. |
| 2007/0069202 | A1* | 3/2007 | Choi et al. ....................... 257/40 |
| 2007/0111324 | A1 | 5/2007 | Nie et al. |
| 2010/0051870 | A1 | 3/2010 | Ramprasad |
| 2014/0312300 | A1 | 10/2014 | Ramprasad et al. |

OTHER PUBLICATIONS

Pileni MP, "Nanomaterials production by soft chemistry," in Nanostructured Materials, Electronic Materials: Science & Technology, 8, 1-21 (2002).*

Chan, Y. et al., Blue semiconductor nanocrystal laser. Appl. Phys. Lett., 86, 073102 (2005).*

Kulkarni, SK et al. Investigations on chemically capped CdS, ZnS, and ZnCdS nanoparticles. App. Surf. Sci. 169-170 (2001) 438-446.*

Zhong, X. et al., "Alloyed $Zn_xCd_{1-x}S$ Nanocrystals with Highly Narrow Luminescence Spectral Width," *J. Am. Chem. Soc.*, 2003, vol. 125, pp. 13559-13563.

Jun, S. et al., "Interfused semiconductor nanocrystals: brilliant blue photoluminescence and electroluminescence," *Chem. Commun.*, 2005, pp. 4616-4618.

Cizeron, J. et al., "Solid Solution of $Cd_yZn_{1-y}S$ Nanosized Particles: Photophysical Properties," *J. Phys. Chem. B*, 1997, vol. 101, pp. 8887-8891.

Jang, E. et al., "High quality CdSeS nanocrystals synthesized by facile single injection process and their electroluminescence," *Chem. Commun.*, 2003, pp. 2964-2965.

Xie, Hai-Yan, et al., "Preparation and Characterization of Overcoated II-VI Quantum Dots," *Journal of Nanoscience and Nanotechnology* (2005) vol. 5 p. 880-886.

de Mello Donegá, Celso, et al., "Single-Step Synthesis to Control the Photoluminescence Quantum Yield and Size Dispersion of CdSe Nanocrystals," *J. Phys. Chem.* (2003) 107 p. 489-196.

Zhong, Xinhua, et al., "Composition-Tunable ZnxCd1-xSe Nanocrystals with High Luminescence and Stability," *J Am. Chem. Soc.* (2003) 125, p. 8589-8594.

Zhong, Xinhua, et al., "Alloyed ZnxCd1-xS Nanocrystals with Highly Narrow Luminescence Spectral Width," *J Am. Chem. Soc.* (2003) 125 p. 13559-13565.

Zhong, Xinhua, et al., "Embryonic Nuclei-Induced Alloying Process for the Reproducible Synthesis of Blue-Emitting ZnxCd1-xSe Nanocrystals with Long-Time Thermal Stability in Size Distribution and Emission Wavelength," *J Phys. Chem.* (2004), 108 p. 15552-15559.

Zhong, Xinhua, et al., "High-Quality Violet-to Red-Emitting ZnSe/ CdSe Core/Shell Nanocrystals," *Chem. Mater.* (2005) 17 p. 4038-4042.

Eason, D. B., et al., "High-brightness blue and green light-emitting diodes," *Appl. Phys. Lett.* 66 (2), Jan. 9, 1995.

Korgel, Brian A., et al., "Controlled Synthesis of Mixed Core and Layered (Zn,Cd)S and (Hg,Cd)S Nanocrystals within Phosphatidylcholine Vesicles," *Langmuir* (2000) 16 p. 3588-3594.

Petrov, D. V., et al., "Size and Band-Gap Dependences of the First Hyperpolarizability of CdxZn1-xS Nanocrystals," *J. Phys. Chem.* (2002) 106 p. 5325-5334.

Steckel, Jonathan S., et al., "Color-Saturated Green-Emitting QD-LEDs," *Angew. Chem. Int. Ed.* (2006) 45 p. 5796-5799.

Wang, Wenzhong, et al., "Room-Temperature Synthesis and Characterization of Nanocrystalline CdS, ZnS, and CdxZn1-xS," *Chem. Mater.* (2002) 14 p. 3028-3033.

Moeller, Greg, et al., "Quantum-Dot Light-Emitting Devices for Displays," Information Display 2006.

* cited by examiner

BLUE LIGHT EMITTING SEMICONDUCTOR NANOCRYSTALS AND DEVICES

CLAIM OF PRIORITY

This application claims priority under 35 USC 371 to International Application No. PCT/US2007/075593, filed on a Aug. 9, 2007, which claims priority to U.S. Provisional Application Ser. No. 60/822,197, filed on Aug. 11, 2006, each of which is incorporated by reference in its entirety.

FEDERAL SPONSORED RESEARCH OR DEVELOPMENT

This invention was made with government support under grant number DAAD19-02-D-0002 awarded by the Army. The U.S. Government has certain rights in this invention.

TECHNICAL FIELD

The present invention relates to blue light emitting devices including semiconductor nanocrystals.

BACKGROUND

Semiconductor nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing nanocrystal size. Consequently, both the optical absorption and emission of nanocrystals shift to the blue (i.e., to higher energies) as the size of the nanocrystals decreases. Semiconductor nanocrystals can have a narrow fluorescence band whose emission wavelength is tunable with the size and material of the nanocrystals.

Light-emitting devices can be used, for example, in displays (e.g., flat-panel displays), screens (e.g., computer screens), and other items that require illumination. Accordingly, the brightness of the light-emitting device is an important feature of the device. Also, low operating voltages and high efficiencies can improve the viability of producing emissive devices. In many applications, long device lifetime is desirable.

SUMMARY

Stable, blue light emitting materials are highly desirable for color display applications. Luminescent semiconductor nanocrystals can be more stable than organic light emitting compounds. Semiconductor nanocrystals can also have narrow emission band widths compared to organic compounds.

In general, a light emitting device can include a plurality of semiconductor nanocrystals. Semiconductor nanocrystal can be an inorganic semiconductor particles, for example, 1-15 nm in diameter, optionally decorated with a layer of organic ligands. Nanocrystals can show strong quantum confinement effects that can be harnessed in designing bottom-up chemical approaches to create complex heterostructures with electronic and optical properties that are tunable with the size and composition of the nanocrystals.

Semiconductor nanocrystals can be used as the lumophore in a light emitting device. Because semiconductor nanocrystals can have narrow emission linewidths, can be photoluminescent efficient, and emission wavelength tunable, they can be a desirable lumophore. Semiconductor nanocrystals can be dispersed in a liquid and are therefore compatible with thin-film deposition techniques such as printing, spin-casting, drop-casting, and dip coating. However, bulk semiconductor nanocrystal solids resulting from these deposition techniques have poor electrical transport properties in solid state light emitting devices. Rather than a bulk solid, a monolayer of semiconductor nanocrystals can be used in a light emitting device. A monolayer provides the beneficial light emission properties of semiconductor nanocrystals while minimizing the impact on electrical performance.

Devices using organic materials for the hole transporting or electron transporting layers (or both) can have high efficiency electricity-to-light conversion, but can suffer from short lifetimes due to the inherent instabilities of the organic materials. The inorganic nanocrystals themselves can be inherently more stable than their organic lumophore counterparts, as evidenced by photoluminescence studies. A light emitting device (LED) that utilizes semiconductor nanocrystals for luminescence and inorganic semiconductors for electrical transport can achieve superior optoelectronic performance and long term stability. The inorganic semiconductors can be deposited by a low temperature method, such as sputtering, vacuum vapor deposition, ink jet printing, or ion plating.

Semiconductor nanocrystals can be deposited on a substrate using microcontact printing. Advantageously, microcontact printing allows micron-scale or nano-scale (e.g., less than 1 mm, less than 500 µm, less than 200 µm, less than 100 µm, less than 25 µm, or less than 1 µm) patterning of features on a surface. In particular, a monolayer of semiconductor nanocrystals can be deposited by microcontact printing. This approach can allow a substantially dry (i.e., substantially solvent-free) application of a patterned semiconductor nanocrystal film on a substrate. A wider variety of substrates can thus be used, because the choice of substrate is not constrained by solubility and surface chemistry requirements.

In one aspect, a semiconductor nanocrystal includes a core including cadmium, zinc, and sulfur. The core can includes ZnCdS. The nanocrystal can include an overcoating on the core, the overcoating including a second semiconductor material. The second semiconductor material can include ZnS. The nanocrystal, can emit blue light, for example, with a quantum efficiency of at least 20%, at least 40%, or at least 50%, when irradiated. The blue light can have a peak wavelength shorter than 470 nm.

In another aspect, a light emitting device includes a first electrode, a second electrode, and a semiconductor nanocrystal described above disposed between the first electrode and the second electrode. The light emitting device can include a first charge transporting layer including a first inorganic material in contact with a first electrode arranged to introduce charge in the first charge transporting layer. The light emitting device can include a second charge transporting layer in contact with the second electrode, wherein the second electrode is arranged to introduce charge in the second charge transporting layer. The first charge transporting layer can be a hole transporting layer. The first charge transporting layer can be an electron transporting layer. The semiconductor nanocrystal can be a member of a plurality of semiconductor nanocrystals forming a monolayer.

In another aspect, a method of forming a device includes depositing a semiconductor nanocrystals described above between a first electrode and a second electrode. A method of generating light includes applying a light-generating potential across the first electrode and the second electrode of the device. A display can include a plurality of the light emitting devices.

Other features, objects, and advantages of the invention will be apparent from the description and drawings, and from the claims.

DETAILED DESCRIPTION

Figure 1:
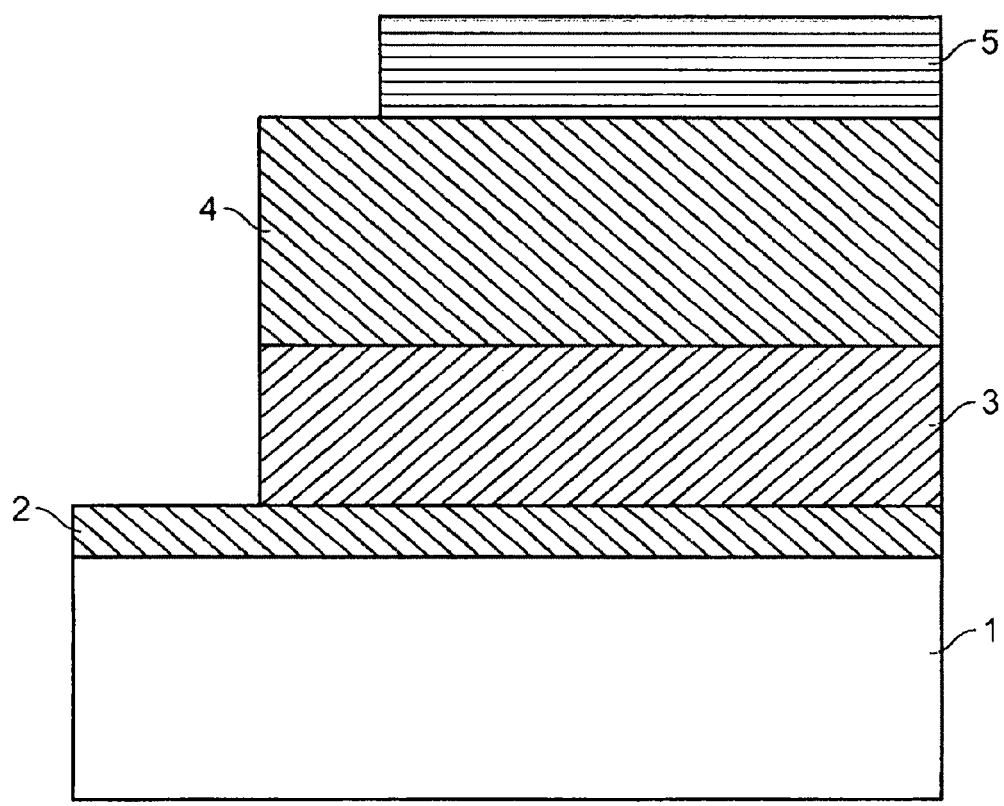
FIG. 1 is a schematic drawing depicting a light-emitting device.
Figure 2:
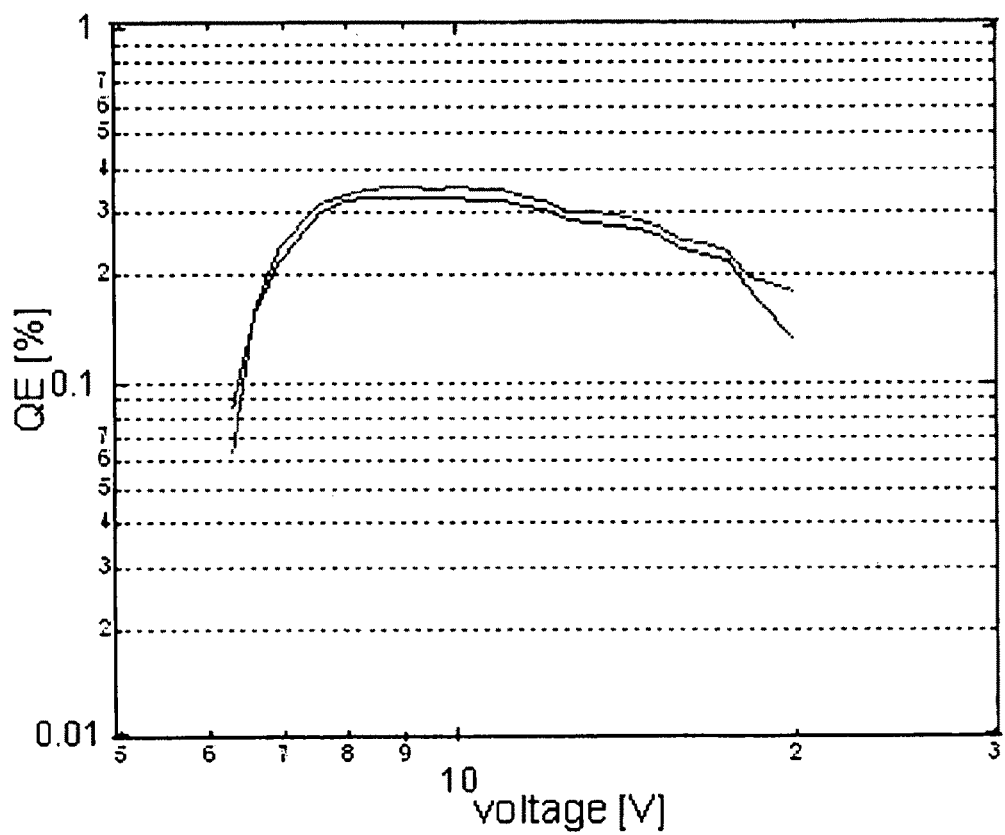
FIG. 2 is a diagram depicting an external quantum efficiency versus voltage for an light emitting device.

Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

The semiconductor can be an alloy, for example, an alloy of Group II-VI compounds, such as an alloy of CdS and ZnS.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO), trishydroxylpropylphosphine (tHPP), or a polymer, for example, a polyacrylic acid. Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines, phosphates, or polymers, such as polyacrylic acids. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

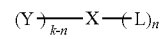

$$(Y)_{k-n}-X-(L)_n$$

wherein k is 2, 3 or 5, and n is 1, 2, 3, 4 or 5 such that k-n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond. The hydrocarbon chain can be optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl. The hydrocarbon chain can also be optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—. Each of R$^a$ and R$^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

A nanocrystal with a core including zinc, cadmium and sulfur, for example ZnCdS, an alloy of ZnS and CdS, having a diameter between 5 and 15 nanometers, for example, 5, 6, 7, 8, 9, 10, 11, 12, 13 14 or 15 nm, can emit light when excited by irradiation. Blue ZnCdS nanocrystals form a blue solution consisting of ZnCdS alloyed nanocrystals with oleylamine organic caps had a photoluminescence peak at λ=440 nm, having a Zn/Cd ratio in the core is 1.25. See, FIG. 7. The nanocrystals can have 20-40% quantum yield. The ZnCdS alloyed nanocrystals can be overcoated, for example, with ZnS, increasing the quantum yield to 40%-60%. These materials can be tuned to emit anywhere from 415 nm to 510 nm with full width half max of 25-30 nm by adjusting the composition and/or diameter of the nanocrystals. See FIG. 6.

A light emitting device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and hole localize on the same molecule, an exciton is formed, which can recombine to emit light. The device can include an emissive layer between the HTL and the ETL. The emissive layer can include a material selected for its emissive properties, such as emission wavelength or linewidth. See, for example, U.S. application Ser. No. 11/071,244, filed Mar. 4, 2005 and U.S. application Ser. No. 11/354,185, filed Feb. 15, 2006, each of which is incorporated by reference in its entirety. A blue light emitting device can be part of a white light emitting device. See, for example, U.S. Application No. 60/773,119, filed Feb. 14, 2006, which is incorporated by reference in its entirety.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 can be a hole transporting layer and second layer 4 can be an electron transporting layer. At least one layer can be non-polymeric. The layers can include an inorganic material. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure. First layer 3 can include a plurality of semiconductor nanocrystals, for example, a substantially monodisperse population of nanocrystals. Alternatively, a separate emissive layer (not shown in FIG. 1) can be included between the hole transporting layer and the electron transporting layer. The separate emissive layer can include the plurality of nanocrystals. A layer that includes nanocrystals can be a monolayer of nanocrystals.

Light emitting devices including semiconductor nanocrystals can be made by spin-casting a solution containing the HTL organic semiconductor molecules and the semiconductor nanocrystals, where the HTL formed underneath of the semiconductor nanocrystal monolayer via phase separation (see, for example, U.S. patent application Ser. No. 10/400,907, filed Mar. 28, 2003, and U.S. Patent Application Publication No. 2004/0023010, each of which is incorporated by reference in its entirety). This phase separation technique reproducibly placed a monolayer of semiconductor nanocrystals between an organic semiconductor HTL and ETL, thereby effectively exploiting the favorable light emission properties of semiconductor nanocrystals, while minimizing their impact on electrical performance. Devices made by this technique were limited by impurities in the solvent, by the necessity to use organic semiconductor molecules that are soluble in the same solvents as the semiconductor nanocrystals. The phase separation technique was unsuitable for depositing a monolayer of semiconductor nanocrystals on top of both a HTL and a HIL (due to the solvent destroying the underlying organic thin film). Nor did the phase separation method allow control of the location of semiconductor nanocrystals that emit different colors on the same substrate; nor patterning of the different color emitting nanocrystals on that same substrate.

Moreover, the organic materials used in the transport layers (i.e., hole transport, hole injection, or electron transport layers) can be less stable than the semiconductor nanocrystals used in the emissive layer. As a result, the operational life of the organic materials limits the life of the device. A device with longer-lived materials in the transport layers can be used to form a longer-lasting light emitting device.

The substrate can be opaque or transparent. A transparent substrate can be used to in the manufacture of a transparent LED. See, for example, Bulovic, V. et al., *Nature* 1996, 380, 29; and Gu, G. et al., *Appl. Phys. Lett.* 1996, 68, 2606-2608, each of which is incorporated by reference in its entirety. Transparent LEDs can be used in applications such as a head-up display, as on a helmet visor or a vehicle windscreen. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg:Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms.

A hole transporting layer (HTL) or an electron transporting layer (ETL) can include an inorganic material, such as an inorganic semiconductor, or an organic material such as N,N'-Bis(3-methylphenyl)-N,N'-bis(phenyl)benzidine (TPD), poly-TPD (a polymer of TPD), (4,4'-N,N'-dicarbazole)biphenyl (CBP), or combinations thereof, as the hole transporting material; and tris-(8-hydroxyquinoline) aluminum ($Alq_3$), 1,3,5-tris(N-phenylbenzimidazol-2-yl)benzene (TBPI), or combinations thereof, as the electron transport material. The layer can be any material with a band gap greater than the emission energy of the emissive material.

The layers can be deposited on a surface of one of the electrodes by spin coating, dip coating, vapor deposition, sputtering, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device. See U.S. patent application Ser. No. 11/253,612, filed Oct. 21, 2005, U.S. patent application Ser. Nos. 11/253,595, and 11/253,612, both filed Oct. 21, 2005, and Ser. No. 11/032,163, filed Jan. 11, 2005, each of which is incorporated by reference in its entirety.

When the electron and hole localize on a nanocrystal, emission can occur at an emission wavelength. The emission has a frequency that corresponds to the band gap of the quantum confined semiconductor material. The band gap is a function of the size of the nanocrystal.

Individual devices can be formed at multiple locations on a single substrate to form a display. The display can include devices that emit at different wavelengths. By patterning the substrate with arrays of different color-emitting materials, a display including pixels of different colors can be formed. In some applications, the substrate can include a backplane. The backplane includes active or passive electronics for controlling or switching power to individual pixels. Include a backplane can be useful for applications such as displays, sensors, or imagers. In particular, the backplane can be configured as an active matrix, passive matrix, fixed format, directly drive, or hybrid. The display can be configured for still images, moving images, or lighting. A lighting display can provide white light, monochrome light, or color-tunable light. See, e.g., U.S. patent application Ser. No. 11/253,612, filed Oct. 21, 2005, which is incorporated by reference in its entirety.

The device can be made in a controlled (oxygen-free and moisture-free) environment, preventing the quenching of luminescent efficiency during the fabrication process. Other multilayer structures may be used to improve the device performance (see, for example, U.S. patent application Ser. Nos. 10/400,907 and 10/400,908, filed Mar. 28, 2003, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris {N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The excited state lifetime ($\tau$) of the nanocrystal is much shorter ($\tau$~10 ns) than a typical phosphor ($\tau$>0.5 ns), enabling nanocrystal-light emitting devices to operate efficiently even at high current density.

Devices can be prepared that emit visible or infrared light. The size and material of a semiconductor nanocrystal can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm.

The device can be thermally treated after application of all of the transport layers. The thermal treatment can further enhance injection of charges into the nanocrystals, as well as eliminate the organic capping groups on the nanocrystals. The instability of the capping groups can contribute to device instability.

For example, a bright blue quantum dot light emitting diode (LED) with external quantum efficiency of 0.35% at 9.1 V (1.73 mA/cm$^2$) with CIE coordinates of (0.19, 0.11), appearing blue to the eye can be prepared from a monolayer of either 20-40% quantum yield ZnCdS alloyed nanocrystals or 40%-60% quantum yield ZnCdS/ZnS alloyed core/shell nanocrystals as the active emission layer in the device. By using these new blue emitting materials as the active layer, this device is over 75% more efficient than previous blue nanocrystal-LEDs.

EXAMPLES

Blue emitting ZnCdS cores were prepared by injecting a syringe containing oleylamine and elemental sulfur into a flask, at 310° C. under argon, containing a clear solution of CdO and ZnO dissolved into oleic acid and octadecene. The method of synthesizing the nanocrystals is adapted from X. Zhong, Y. Feng, W. Knoll, and M. Han, J. Am. Chem. Soc. 2003, 125, 13559, which is incorporated by reference in its entirety. The solution turned from clear to yellow and remained stirring in the pot at 270° C. for ~30 minutes. Afterward the ZnCdS cores were precipitated by the addition of acetone to the growth solution and separated from the supernatant by centrifugation before being redispersed in hexane for overcoating with ZnS or to be precipitated a second time with butanol/acetone and redispersed in chloroform for deposition in a device. The quantum yield of the cores was found to be ~40% after processing. Blue cores could be overcoated by adding particles in hexane to a solution of trioctylphosphine (TOP) and oleylamine then removing the hexane under vacuum at 80° C. The pot was subsequently heated to 210° C. and a solution of diethyl zinc and hexamethyldisilathiane ((TMS$_2$)S) was added dropwise. After the addition the solution was cooled to room temperature at which point the nanocrystals spontaneously precipitated from solution. After centrifuging the solution, the precipitate was redissolved in hexane and butanol. Nanocrystals, having a ZnCdS/ZnS core/shell structure, were then precipitated a second time using acetone, centrifuged and redispersed in chloroform, as described above. The quantum yield for the ZnCdS/ZnS nanocrystals was found to be between 60% and 40%, as compared to coumarin 480, and the nanocrystals were found to be 8-10 nm in diameter. The ratio of zinc to cadmium in the core can be greater than 0.2, greater than 0.5, greater than 0.75, greater than 1.0, greater than 1.1, greater than 1.2, less than 5, less than 3, less than 2, or less than 1.25.

The potential application of this new type of colloidal nanocrystals is in the light emitting devices. Due to their high photoluminescence quantum yield these nanocrystals may potentially lead to higher efficiency in electroluminescent devices. As an example of such an application we demonstrate the blue nanocrystal based LED (nanocrystal-LED) that utilizes the nanocrystals described in this document as an emissive layer. Our device consists of a transparent anode of indium tin oxide (ITO) on top of a glass substrate with a layer of conducting polymer poly(3,4-ethylenedioxythiophene):poly(styrenesulfonate) PEDOT:PSS that improves surface properties as well as hole injection from the ITO contact, 40 nm thick hole transporting layer (HTL) of N,N'-Bis(3-methylphenyl)-N,N'-bis(phenyl) benzidine (TPD), an emissive monolayer of colloidal nanocrystals, 27 nm thick hole blocking layer (HBL) of 3,4,5-triphenyl-1,2,4-triazole (TAZ) (to prevent exciton formation anywhere except nanocrystals), 20 nm thick electron transporting layer (ETL) of tris-(8-hydroxyquinoline) aluminum (Alq$_3$), and finally 100 nm thick cathode of magnesium silver alloy, coated with a 20 nm silver protective layer. This device exhibits a narrow electroluminescence spectrum characteristic to the colloidal nanocrystals with minor contributions from TPD and Alq$_3$, that can be potentially eliminated by changing the organic materials for the charge transporting layers to the ones with a wider bandgap. Despite the minor organic contributions to the nanocrystal-LED spectrum device appears blue to the eye in the wide range of applied voltages (up to 20 V), with its CIE (Commission Internationale de E'Eclairage) coordinates of (0.19, 0.11). The peak blue nanocrystal-LED had an external quantum efficiency (EQE) to be 0.35% at 9.1 V (1.73 mA/cm$^2$) which makes this device 75% more efficient than previously reported devices with EQE=0.2%.

Figure 3:
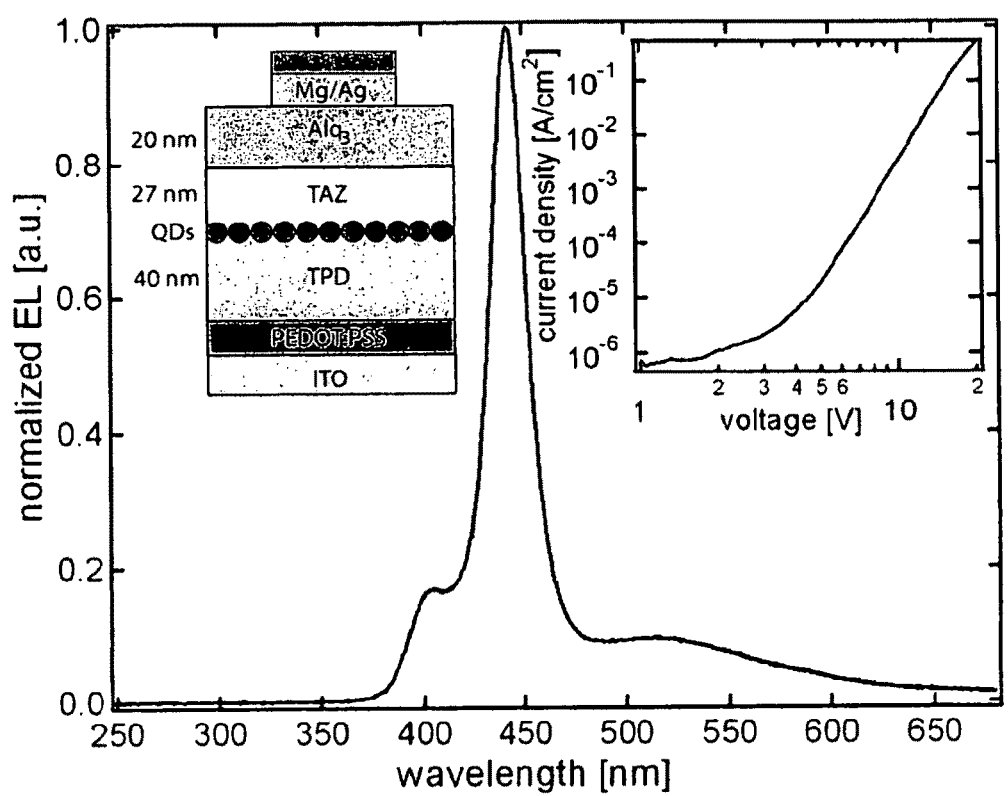
FIG. 3 is a graph depicting an electroluminescence spectrum of a light emitting device including a nanocrystal.
Figure 4:
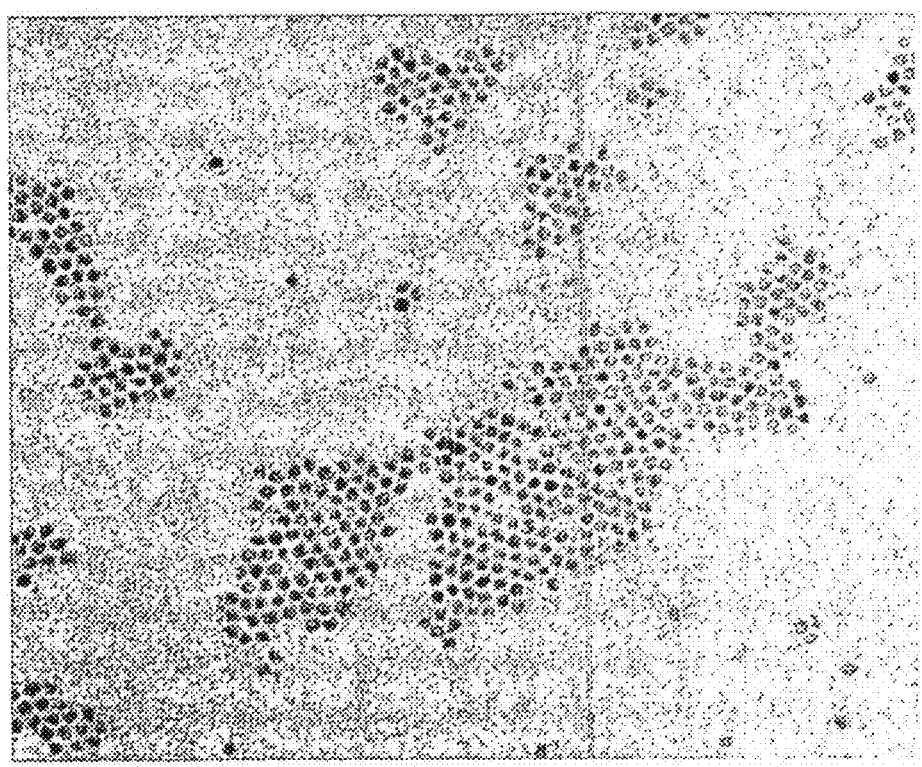
FIG. 4 is a micrograph of nanocrystals.
Figure 5:
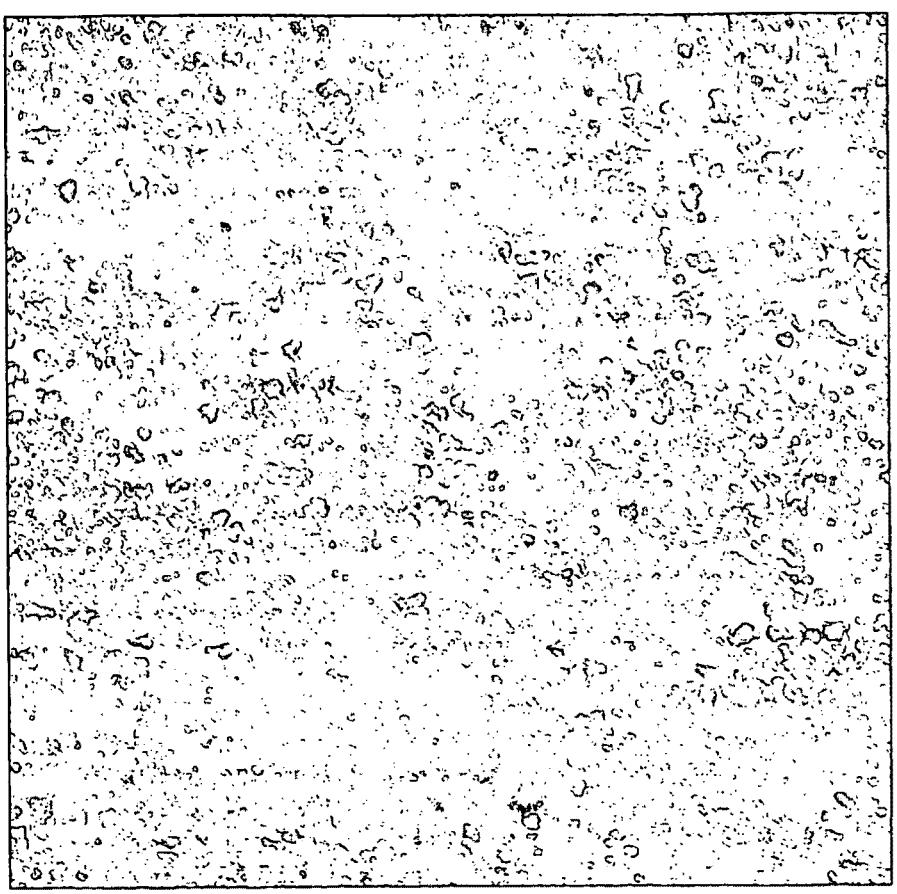
FIG. 5 is an atomic force micrograph of a monolayer of nanocrystals.
Figure 6:
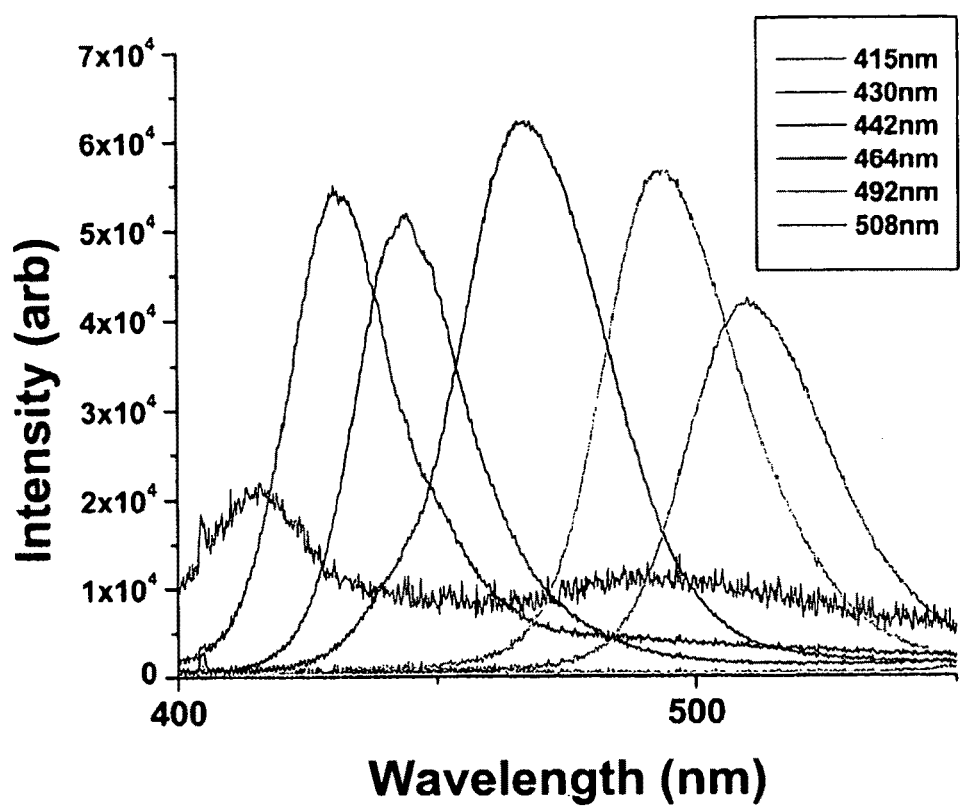
FIG. 6 is a graph depicting emission spectra from various nanocrystals.
Figure 7:
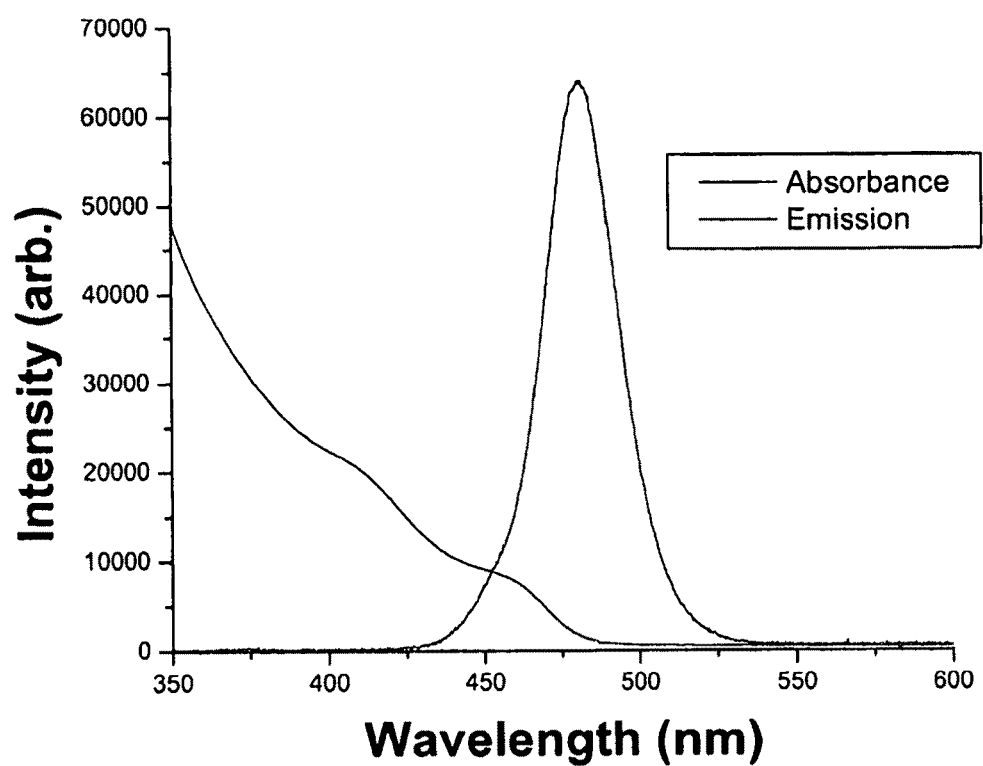
FIG. 7 is a graph depicting absorption and emission from nanocrystals.
Figure 8:
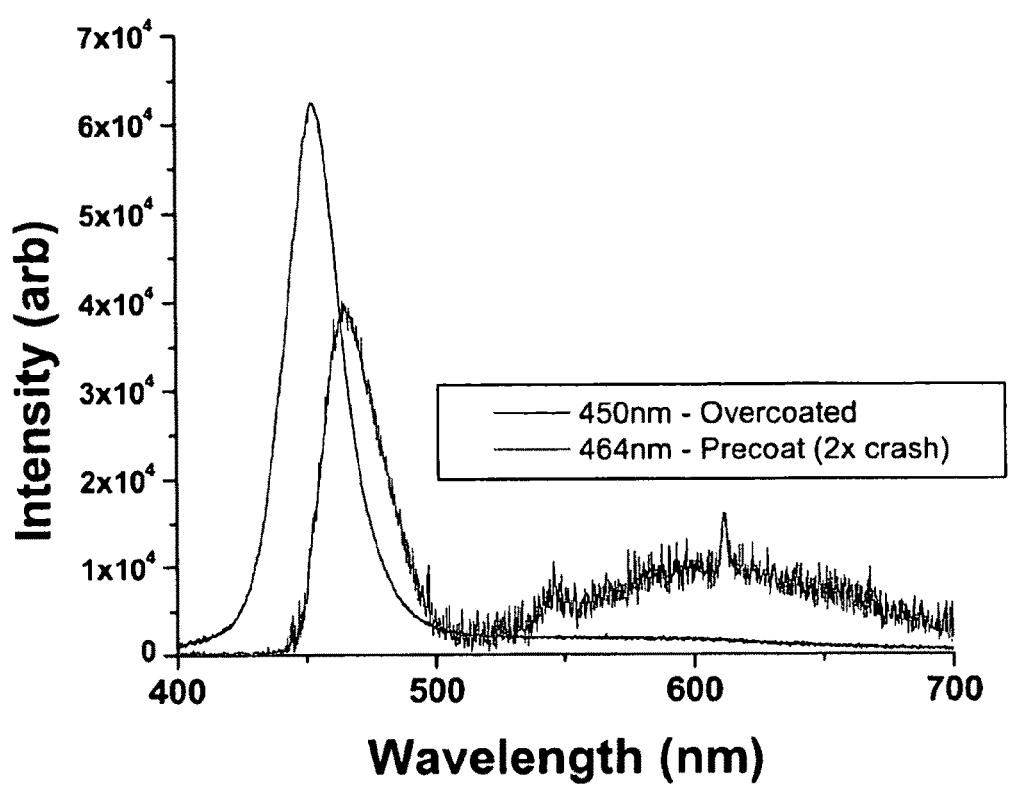
FIG. 8 is a graph depicting comparative emission of ZnCdS particles prior to overcoating and after overcoating.

FIG. 3 is a graph depicting electroluminescence from an ITO/TPD/ZnCdS/Alq3/AgMg device. FIG. 4 is a transmission electron micrograph of ZnCdS/ZnS particles at 68,000 times magnification. FIG. 5 is an atomic force micrograph of a monolayer of ZnCdS particles stamped onto the TPD layer. FIG. 6 is a graph depicting emission spectra from ZnCdS cores of different sizes and alloying ratios. FIG. 7 is a graph depicting absorption and emission from overcoated ZnCdS/ZnS nanocrystals. FIG. 8 is a graph depicting comparative emission of ZnCdS particles prior to overcoating (grey line) and after overcoating (blue line). Overcoating eliminates any trap state emission.

Other embodiments are within the scope of the following claims.

What is claimed is:

1. A colloidally grown semiconductor nanocrystal comprising a core including an alloy comprising cadmium, zinc, and sulfur, wherein the nanocrystal includes an overcoating on the core and the nanocrystal when excited emits blue light with a quantum efficiency of at least 40%, wherein a surface of the nanocrystal includes an amine, wherein a ratio of zinc to cadmium in the core is greater than 0.2,
    wherein the overcoating includes a second semiconductor material having a thickness up to ten monolayers, wherein a surface of the second semiconductor material includes a layer of organic ligands.

2. The nanocrystal of claim 1, wherein the core includes ZnCdS.

3. The nanocrystal of claim 1, wherein the second semiconductor material includes ZnS.

4. The nanocrystal of claim 1, wherein the blue light has a peak wavelength shorter than 470 nm.

5. A light emitting device comprising:
    a first electrode;
    a second electrode; and
    a colloidally grown semiconductor nanocrystal comprising a core including an alloy comprising cadmium, zinc, and sulfur, wherein the nanocrystal includes an overcoating on the core and the nanocrystal when excited emits blue light with a quantum efficiency of at least 40%, wherein a surface of the nanocrystal includes an amine, wherein a ratio of zinc to cadmium in the core is greater than 0.2,
    wherein the overcoating includes a second semiconductor material having a thickness up to ten monolayers, wherein a surface of the second semiconductor material includes a layer of organic ligands.

6. The light emitting device of claim 5, further comprising a first charge transporting layer including a first inorganic material in contact with a first electrode arranged to introduce charge in the first charge transporting layer.

7. The light emitting device of claim 6, further comprising a second charge transporting layer in contact with the second electrode, wherein the second electrode is arranged to introduce charge in the second charge transporting layer.

8. The light emitting device of claim 6, wherein the first charge transporting layer is a hole transporting layer.

9. The light emitting device of claim 7, wherein the second charge transporting layer is an electron transporting layer.

10. The light emitting device of claim 5, wherein the semiconductor nanocrystal is a member of a plurality of semiconductor nanocrystals forming a monolayer.

11. A method of forming a device, comprising:
    depositing a colloidally grown semiconductor nanocrystal comprising a core including an alloy including cadmium, zinc, and sulfur between a first electrode and a second electrode, wherein the nanocrystal includes an overcoating on the core and the nanocrystal when excited emits blue light with a quantum efficiency of at least 40%, wherein a surface of the nanocrystal includes an amine, wherein a ratio of zinc to cadmium in the core is greater than 0.2,
    wherein the overcoating includes a second semiconductor material having a thickness up to ten monolayers, wherein a surface of the second semiconductor material includes a layer of organic ligands.

12. A method of generating light comprising:
applying a light-generating potential across a first electrode and a second electrode of a device comprising:
a first electrode;
a second electrode; and
a colloidally grown semiconductor nanocrystal comprising a core including an alloy comprising cadmium, zinc, and sulfur disposed between the first electrode and the second electrode, wherein the nanocrystal includes an overcoating on the core and the nanocrystal when excited emits blue light with a quantum efficiency of at least 40%, wherein a surface of the nanocrystal includes an amine, wherein a ratio of zinc to cadmium in the core is greater than 0.2,
wherein the overcoating includes a second semiconductor material having a thickness up to ten monolayers, wherein a surface of the second semiconductor material includes a layer of organic ligands.

13. A display including a plurality of light emitting devices, each device comprising:
a first electrode;
a second electrode; and
a colloidally grown semiconductor nanocrystal comprising a core including an alloy comprising cadmium, zinc, and sulfur disposed between the first electrode and the second electrode, wherein the nanocrystal includes an overcoating on the core and the nanocrystal when excited emits blue light with a quantum efficiency of at least 40%, wherein a surface of the nanocrystal includes an amine, wherein a ratio of zinc to cadmium in the core is greater than 0.2,
wherein the overcoating includes a second semiconductor material having a thickness up to ten monolayers, wherein a surface of the second semiconductor material includes a layer of organic ligands.

* * * * *